United States Patent
Lance, Jr. et al.

[11] Patent Number: 5,697,148
[45] Date of Patent: Dec. 16, 1997

[54] FLIP UNDERFILL INJECTION TECHNIQUE

[75] Inventors: James George Lance, Jr., Lake Worth; Robert Kenneth Doot, Boynton Beach; Karl Marcus Wahlfrid, Delray Beach, all of Fla.

[73] Assignee: Motorola, Inc., Schaumburg, Ill.

[21] Appl. No.: 517,977

[22] Filed: Aug. 22, 1995

[51] Int. Cl.⁶ .................................................. H05K 3/34
[52] U.S. Cl. ................... 29/840; 174/260; 428/901; 437/220
[58] Field of Search .............. 29/840, 832; 437/220; 428/901; 174/260

[56] References Cited

U.S. PATENT DOCUMENTS

| | | | |
|---|---|---|---|
| 5,162,613 | 11/1992 | Schoenthaler | 29/832 X |
| 5,203,076 | 4/1993 | Banerji et al. | 29/840 |
| 5,274,913 | 1/1994 | Grebe et al. | 29/840 |
| 5,355,580 | 10/1994 | Tsukada | 29/840 |
| 5,386,624 | 2/1995 | George et al. | 29/840 X |
| 5,474,958 | 12/1995 | Djennas et al. | 437/220 X |

FOREIGN PATENT DOCUMENTS 6-97666  4/1994  Japan ........................ 29/832

OTHER PUBLICATIONS

IBM Technical Disclosure vol. 32 No. 10B Mar. 1990 p. 480.

*Primary Examiner*—Carl J. Arbes
*Attorney, Agent, or Firm*—Philip P. Macnak

[57] ABSTRACT

A method for dispensing underfill material between a flip chip bonded to substrate. The method requires an underfill injection port to be drilled through the substrate prior to reflow such that underfill material can be dispensed between the flip chip and substrate through the port. After reflow is completed, a pressurized pump delivers a predetermined amount of underfill under hydraulic pressure through the underfill injection port between the flip chip and substrate. Once injected, the underfill migrates between the flip chip and substrate via capillary action pushing out any air around the joints.

18 Claims, 4 Drawing Sheets

FLIP UNDERFILL INJECTION TECHNIQUE

FIELD OF THE INVENTION

This invention relates generally to a method for attaching a die to a substrate, and more particularly, to an improved method for underfilling a flip chip soldered to a printed circuit board.

BACKGROUND OF THE INVENTION

One popular VLSI packaging scheme is known as flip chip. Flip chip technology employs small solder bumps that are used to connect a die with a substrate. The solder-bump interconnection was introduced in the 1960's to eliminate the expense and unreliability of wire bonding as well as increase the joint density between the die and substrate. Flip chip bonding also known as the Controlled Collapse Chip Connection (C4) utilizes solder bumps deposited on wettable metal terminals on the chip known as ball limiting metallurgy (BLM) and a matching footprint of solder bumps deposited on solder wettable terminals on the substrate know as top side metallurgy (TSM).

Once the BLM, TSM and solder are in place, the joining of chips to the substrate using C4 technology is straightforward. Flux is placed on the substrate as a temporary adhesive to hold the chips in place. Thereafter, the die is flipped (hence "flip chip") and aligned with the footprint on the substrate. The assembly is then subjected to a thermal reflow cycle involving individual chip or multi-chip joining to the substrate using an oven. Accordingly, all electrical joints are made simultaneously by reflowing solder leaving a small gap between the die and substrate. Once the die joining operation is complete, cleaning of flux residues is accomplished with such solvents as chlorinated solvents or xylene for rosin flux and water soluble flux. At this point the assembly can be electrically tested.

In return for higher joint density and better electrical connections flip chip suffers from thermal expansion problems. A well known problem regarding flip-chip bonding is the ability of the joints to maintain structural integrity and electrical continuity over a lifetime of module thermal cycling. Specifically, a thermal expansivity mismatch between the chip and the substrate causes shear displacement to be applied to each joint. The shear displacement between the silicon die and the epoxy-glass substrate causes joint failure and in an extreme case can cause the die to detach from the substrate. Additionally, shear displacement increases as a function of die size due to the increased area for expansion between the die and substrate.

In order to alleviate the problems associated with thermal mismatch an underfill material is injected into the gap between the flip chip and the substrate that remains after the solder has been reflowed. Underfilling, extends solder joint life by limiting relative displacement between the chip and the substrate during thermal cycling.

As shown in FIGS. 1 and 2 underfill material 22 is injected along the sides of the die into a reflow gap between the die 12 and the substrate 14. In particular, underfill is injected along two adjacent sides 24 of die 12 via a pressurized pump 28 as indicated by the arrows in FIG. 2. After waiting a predetermined amount of time for the underfill material to migrate under the die via capillary action, pump 28 is directed to dispense underfill material under the remaining two sides 26 to completely encapsulate the die. However, this underfill process requires a complex vision system to locate the moving needle such that underfill is properly dispensed along the sides of the die. Additionally, the prior art process is time intensive requiring waiting time between injecting alternate sides of the die. Furthermore, by injecting underfill along the sides of the die it is possible to trap air bubbles under the die which prohibits the underfill from encapsulating the joints where the air bubble is present. Yet another shortcoming of the prior art method is that it requires the underfill material to have certain flow characteristics which minimize air trapping under the die, while maximizing capillary effects.

Another prior art method (not shown) of attaching a flip chip to a substrate involves cutting a hole slightly smaller than the die in the bottom of the substrate and dripping underfill material through the hole. The underfill material then migrates between the die and substrate where it hardens. However, this method of attaching a chip to the substrate requires that a relatively large hole be drilled in the substrate which decreases the number of joints or attachments that can be made with the substrate. Additionally, the hole decreases the "real estate" on the substrate which can be used for circuit pathways or vias. Moreover, since there is little substrate left under the die, there is less surface area for bonding the die to the substrate.

Accordingly, there is a need for a simpler and quicker method for underfilling a die that does not significantly decrease the available die or substrate real estate.

SUMMARY OF THE INVENTION

In accordance with a first aspect of the present invention, a method for under filling a flip chip which is attached to a substrate at about a footprint where the flip chip attaches to the substrate utilizing solder joints, comprises the steps of:

providing a hole through the substrate under the footprint prior to attaching the flip chip to the substrate;

aligning a means for dispensing an underfill material with the hole after the flip chip is attached to the substrate; and dispensing, under hydraulic pressure, a predetermined amount of underfill material through the hole to substantially eliminate air between the flip chip and the substrate and about the solder joints.

In accordance with a second aspect of the present invention, a method for attaching a flip chip having a plurality of solder balls to a substrate having a footprint comprising a plurality of corresponding solder balls, comprises the steps of:

providing a hole in the substrate beneath the plurality of corresponding solder balls on the substrate;

fluxing a predetermined area on the substrate;

aligning the plurality of solder balls proximal to the plurality of corresponding solder balls;

heating the flip chip and the substrate such that the plurality of solder balls and the plurality of corresponding solder balls coalesce into a plurality of solder joints;

aligning a means for dispensing an underfill material with the hole; and dispensing, under hydraulic pressure, a predetermined amount of underfill material through the hole to substantially eliminate air between the flip chip and the substrate and about the plurality of solder joints.

In accordance with a third acpest of the present invention a method for attaching a flip chip having a plurality of connecting pads to a substrate having a footprint comprising a corresponding plurality of connecting pads comprises the steps of:

providing a connection media between the plurality of connecting pads and the corresponding plurality of connecting pads;

providing a hole in the substrate beneath the plurality of corresponding connecting pads;

aligning the plurality of connecting pads proximal to the plurality of corresponding connecting pads;

connecting the plurality of connecting pads with the plurality of corresponding connecting pads;

aligning a means for dispensing an underfill material with the hole; and dispensing, under hydraulic pressure, a predetermined amount of underfill material through the hole to substantially eliminate voids in the underfill material between the flip chip and the substrate and about the connection media.

DESCRIPTION OF THE PREFERRED EMBODIMENT

Figure 6:
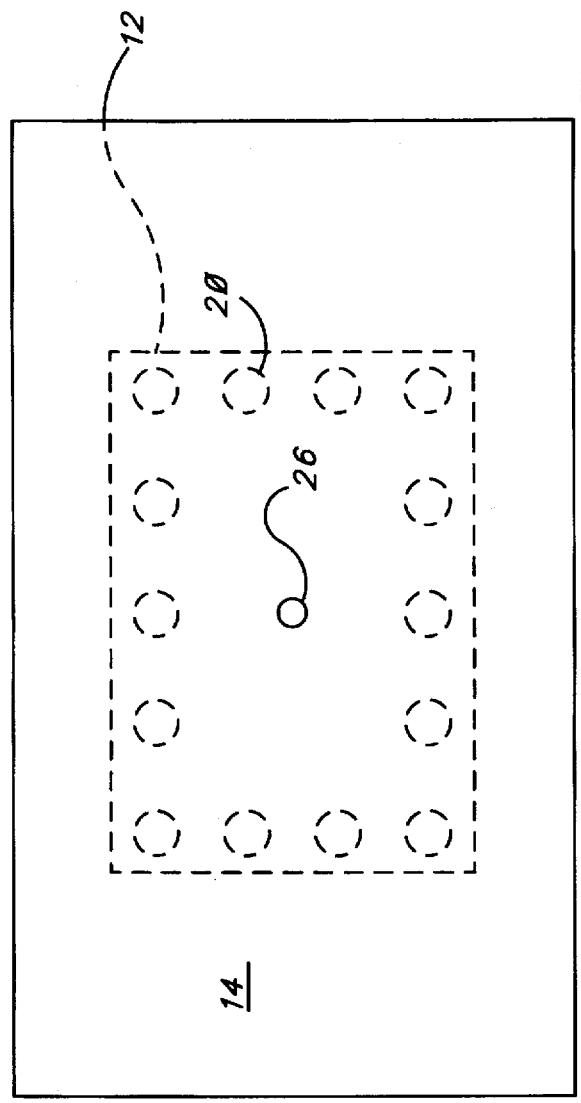
FIG. 6 is a bottom view of the substrate.

With references to FIGS. 3–6, there is depicted an improved method for attaching a flipped chip to a substrate. The first step, as shown in FIG. 6, involves drilling an underfill injection port 26 in substrate 14 directly below the area where the die 12 is attached to the substrate at the time of manufacture of the substrate to provide a hole for underfill injection. The hole can be especially drilled for underfill injection, or can be an existing via providing electrical connection between conductors on top and bottom surfaces of the substrate 14. In the preferred embodiment, underfill injection port 26 is centrally located under die 12 such that even underfill is achieved without difficulty.

Preferably, underfill injection port 26 is small so as to conserve substrate real estate that could otherwise be used for via's and circuit pathways. Additionally, a small underfill injection port increases the available silicon die real estate in which I/O connections can be made with the substrate. In the preferred embodiment, underfill injection port 26 may have a diameter as small as 5 mils or smaller in order to conserve die and substrate real estate.

Figure 1:
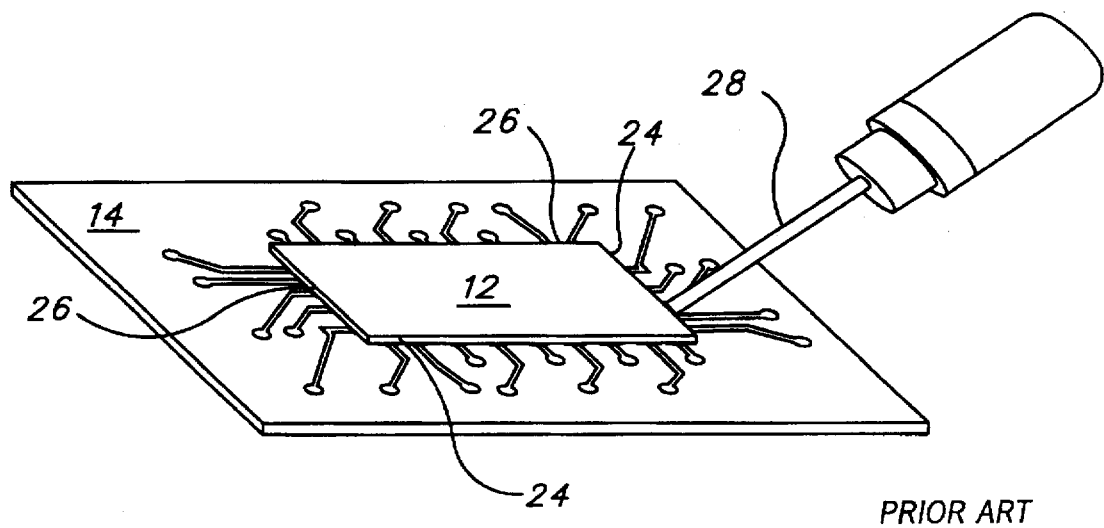
FIG. 1 is a perspective view of a die and substrate illustrating the prior an underfill method.
Figure 2:
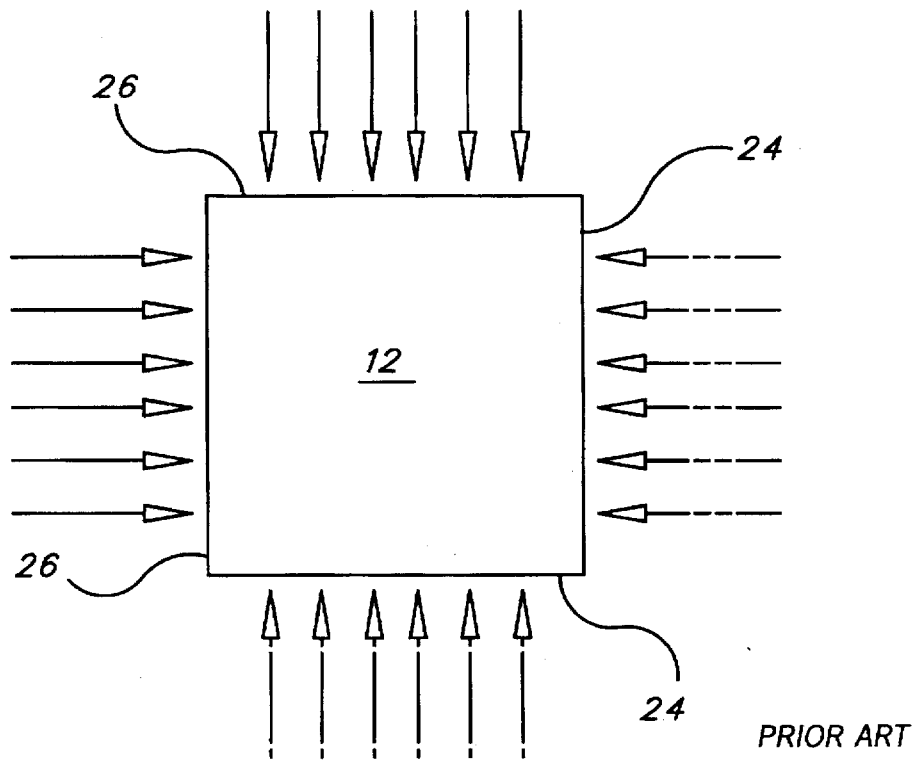
FIG. 2 is a plan view of the underfill flow pattern of the prior art underfill method.
Figure 3A:
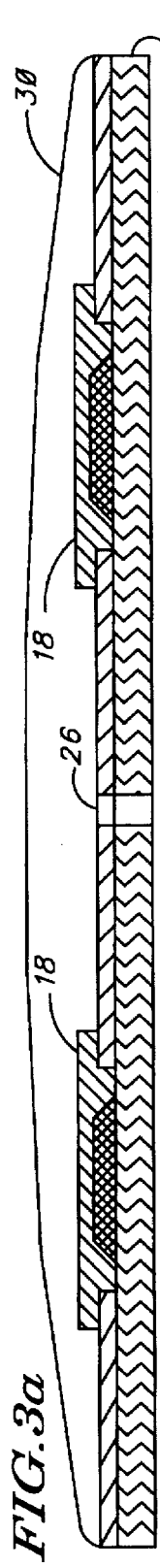
FIG. 3(a–d) is a side elevational view in cross section illustrating the steps of attaching a flip chip in accordance with the present invention.
Figure 3B:
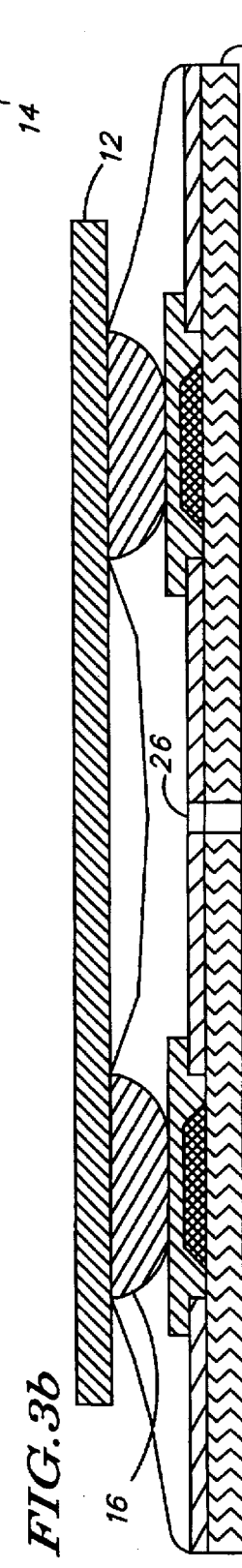
Figure 3C:
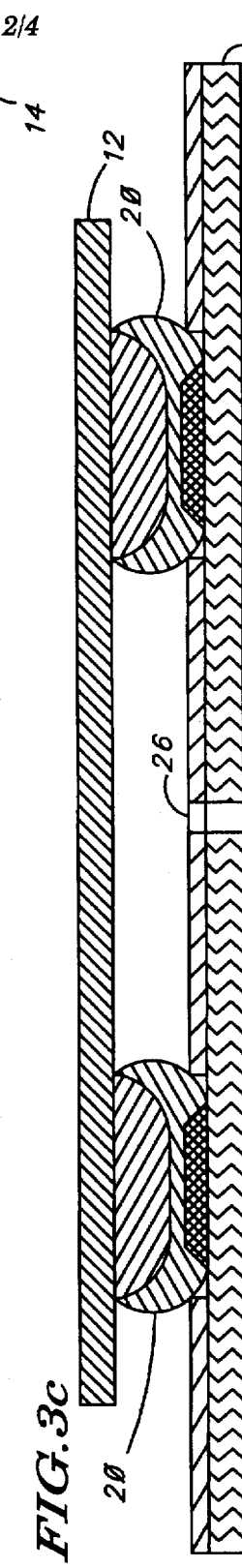
Figure 3D:
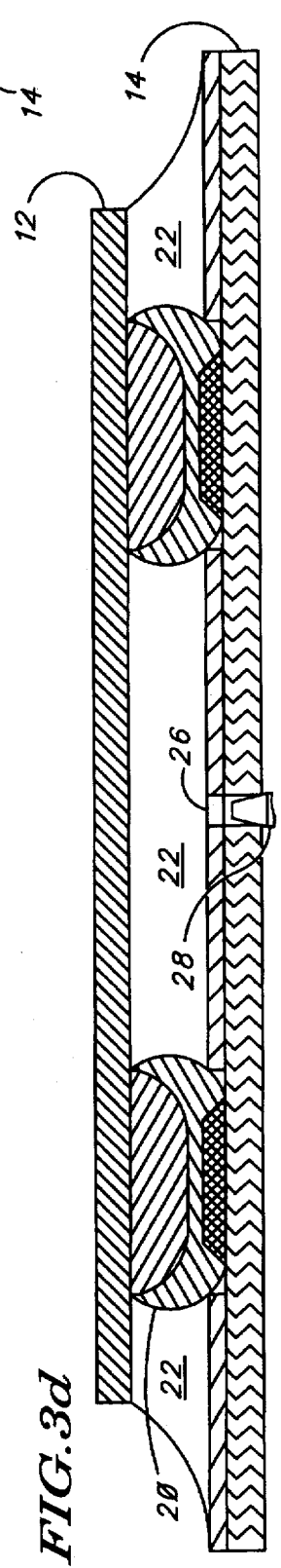

The second step, shown in FIG. 3(a), involves fluxing the substrate over the area where the die will be attached. Flux 22 serves as a temporary adhesive to hold the die in place before connection pads having preformed solder bumps 16–18 are reflowed. In step three, FIG. 3(b), the die is flipped and aligned with solder bumps 18 (the footprint) on substrate 14. In step four, shown in FIG. 3(c), the assembly is subjected to a thermal reflow cycle wherein die 12 and substrate 14 are heated in an oven to a temperature high enough to melt solder bumps 16–18 on the BLM and TSM without damaging the die or substrate. As illustrated, the reflow process simultaneously forms joints 20 which serve as electrical connections between connection pads on die 12 and connection pads on substrate 14. Thereafter, any remaining flux 22 is removed using conventional techniques.

Figure 4:
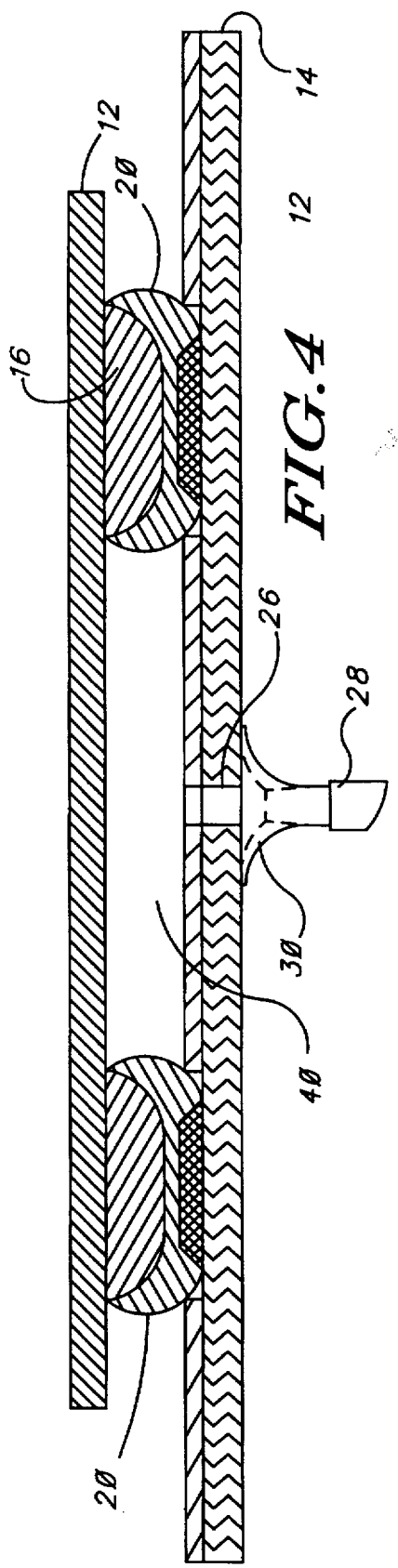
FIG. 4 is a side elevational view in cross section of an alternate means for injecting underfill in accordance with the present invention.
Figure 7:
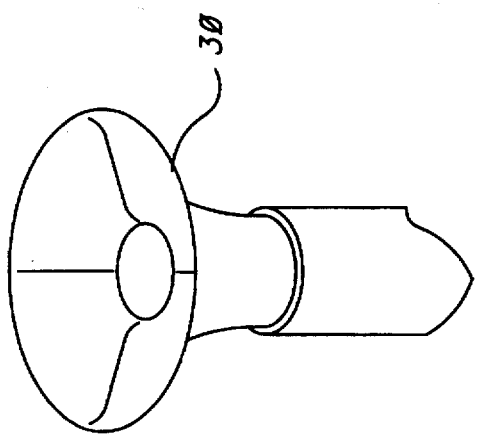
FIG. 7 is a perspective view of the rubber cup.
Figure 5:
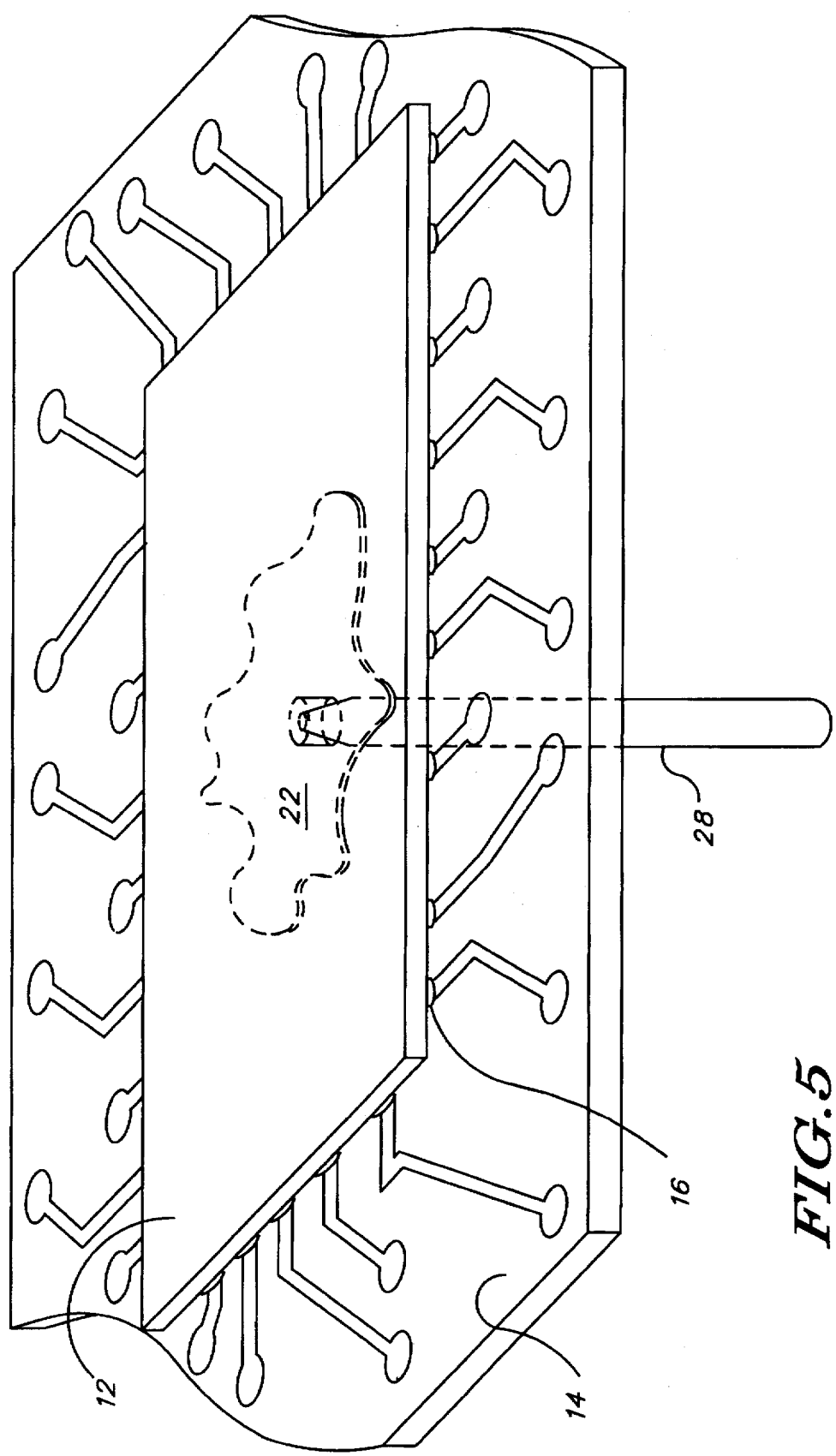
FIG. 5 is a perspective view of the underfill method of the present invention.

Although solder bumps 16–18 on the BLM and TSM collapse during the reflow step, there remains a small reflow space 40 between the die and substrate after reflowing is complete. Reflow space 40 permits an underfill material 22 to be injected between the die and substrate which prevents the plastic deformation of solder joints 20 that would otherwise result from thermal cycling. In step five, as shown in FIG. 3(i d), needle 28 is inserted into underfill injection port 26. Thereafter, a pressurized pump (not shown) delivers a predetermined amount of underfill material 22 into reflow space 40. Once injected, underfill material 22 migrates between the die and substrate via capillary action pushing out any remaining air surrounding joints 20 thereby encapsulating the joints and completing the attachment process. In an alternate embodiment, as shown in FIG. 4, needle 28 can be replaced with a an elastomeric dispensing tip having a predetermined compliance, such as a rubber cup 30 (FIG. 4 and 7) which is generally aligned with the underfill injection port 26 prior to dispensing underfill material 22.

In an alternate embodiment, solder bumps 16–18 and correction pads 12 may be substituted with alternate correction media. For example, eutectic bumps or conductive adhesive can be substituted for the reflowable bumps and pads. Accordingly, such alternate embodiments are considered within the spirit and scope of the present invention.

The present method of injecting underfill material 22 through an underfill injection port in the substrate has many advantages. First, by injecting underfill material from a central location and allowing it to flow outwardly via hydraulic pressure and capillary action, all of the underfill material can be injected in one application. Additionally, since all the underfill material is applied in one application the present method is significantly faster than prior art methods.

Another advantage of the present invention is that central dispersement of underfill material reduces the chance of air entrapment between the die and substrate and thereby reduces voids where joints 20 are not encapsulated. In turn, this increases the reliability of the die attachment since encapsulated joints are better able to withstand thermal cycling. Also, the present invention opens up the possibility of using different underfill materials that would not have been feasible using the prior art methods. Moreover, central disbursement decreases the distance which underfill need migrate under the die.

Yet another advantage of injecting underfill through a central port is that a complex vision system is not always required. Underfilling a die using the prior art method requires a vision system to guide the needle along the sides of the die while underfill material is being injected. In contrast, the present method only requires the needle or cup be placed in one position prior to injecting the underfill. Accordingly, a complex vision system is not required.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. A method for underfilling a flip chip attached to a substrate, said substrate having a footprint where said flip chip is attached to the substrate utilizing solder joints, said method comprising the steps of:

providing a hole through the substrate under said footprint prior to attaching said flip chip to said substrate;

aligning a means for dispensing an underfill material with said hole after said flip chip is attached to said substrate; and dispensing, under hydraulic pressure, a predetermined amount of underfill material through said hole to substantially eliminate air between said flip chip and said substrate and about the solder joints.

2. The method of underfilling as set forth in claim 1 wherein said hole is centrally located in said footprint.

3. The method of underfilling as set forth in claim 1 wherein said means for dispensing is a needle and pump.

4. The method of underfilling as set forth in claim 1 wherein said means for dispensing is an elastomeric dispensing tip and pump.

5. A method for underfilling as set forth in claim 1 further comprising the step of:

allowing the underfill material to migrate between said flip chip and said substrate utilizing capillary action to reduce voids about the solder joints.

6. A method for attaching a flip chip having a plurality of solder balls to a substrate having a footprint comprising a plurality of corresponding solder balls, said method comprising:

providing a hole in said substrate beneath said plurality of corresponding solder balls on said substrate;

fluxing a predetermined area on said substrate;

aligning said plurality of solder balls proximal to said plurality of corresponding solder balls;

heating said flip chip and said substrate such that said plurality of solder balls and said plurality of corresponding solder balls coalesce into a plurality of solder joints;

aligning a means for dispensing an underfill material with said hole; and dispensing, under hydraulic pressure, a predetermined amount of underfill material through said hole to substantially eliminate air between said flip chip and said substrate and about said plurality of solder joints.

7. The method of for attaching a flip chip as set forth in claim 6 wherein said hole is centrally located in said footprint.

8. The method for attaching a flip chip as set forth in claim 6 wherein said means for dispensing an underfill material is a needle and pump.

9. The method for attaching a flip chip as set forth in claim 6 wherein said means for dispensing is an elastomeric dispensing tip and pump.

10. A method for attaching a flip chip as set forth in claim 6 further comprising the step of:

allowing the underfill material to migrate between said flip chip and said substrate utilizing capillary action to reduce voids about the plurality of joints.

11. A method for attaching a flip chip having a plurality of connecting pads to a substrate having a footprint comprising a corresponding plurality of connecting pads, said method comprising:

providing a connection media between said plurality of connecting pads and said corresponding plurality of connecting pads;

providing a hole in said substrate beneath said plurality of corresponding connecting pads;

aligning said plurality of connecting pads proximal to said plurality of corresponding connecting pads;

connecting said plurality of connecting pads with said plurality of corresponding connecting pads;

aligning a means for dispensing an underfill material with said hole; and dispensing, under hydraulic pressure, a predetermined amount of underfill material through said hole to substantially eliminate voids in the underfill material between said flip chip and said substrate and about the connection media.

12. The method for attaching a flip chip as set forth in claim 11 wherein said hole is centrally located in said footprint.

13. The method for attaching a flip chip as set forth in claim 11 wherein said means for dispensing an underfill material is a needle and pump.

14. The method for attaching a flip chip as set forth in claim 11 wherein said means for dispensing is an elastomeric dispensing tip and pump.

15. The method for attaching a flip chip as set forth in claim 11 wherein said connection media is a plurality of solder balls on said flip chip and said substrate.

16. The method for attaching a flip chip as set forth in claim 11 wherein said connection media is a plurality of eutectic bumps on said flip chip.

17. The method for attaching a flip chip as set forth in claim 11 wherein said connection media is a plurality of conductive adhesive columns on said flip chip or substrate.

18. The method for attaching a flip chip as set forth in claim 11 further comprising the step of:

allowing the underfill material to migrate between said flip chip and said substrate utilizing capillary action to eliminate air about the connection media.

* * * * *